United States Patent [19]

Geddes

[11] Patent Number: 5,003,512
[45] Date of Patent: Mar. 26, 1991

[54] INTEGRATED MEMORY CIRCUIT HAVING A HIGH-VOLTAGE SWITCH

[75] Inventor: Ronald C. Geddes, Hausen, Switzerland

[73] Assignee: U.S. Philips Corp., New York, N.Y.

[21] Appl. No.: 306,191

[22] Filed: Feb. 2, 1989

[30] Foreign Application Priority Data

Feb. 18, 1988 [NL] Netherlands ............... 8800408

[51] Int. Cl.$^5$ ............................................. G11C 17/00
[52] U.S. Cl. .................. 365/189.09; 365/191; 365/233
[58] Field of Search ............ 365/182, 185, 191, 203, 365/204, 233, 189.09

[56] References Cited

U.S. PATENT DOCUMENTS

| | | | |
|---|---|---|---|
| 4,527,074 | 7/1985 | Donaldson et al. | 307/246 |
| 4,734,599 | 3/1988 | Bohac, Jr. | 307/497 |

Primary Examiner—Joseph A. Popek
Attorney, Agent, or Firm—Steven R. Biren

[57] ABSTRACT

An integrated memory circuit includes a high-voltage switch which is connected between a programming voltage generator and an erasable programmable memory. In the preferred embodiment of the memory circuit, the switch includes a first transistor of the field-effect enhancement type which is connected between a high-voltage point and a control electrode of a second transistor, also being of the field-efffect enhancement type, which is connected between the high-voltage point and the control electrode of the first transistor. By driving the two control electrodes by means of mutually complementary clock signals, via a capacitance, the programming voltage is step-wise built up on the control electrodes of the cross-wise coupled transistors. The switch is less susceptible to crosstalk on the clock lines and is realized using fewer masking steps than the prior art switch.

3 Claims, 1 Drawing Sheet

INTEGRATED MEMORY CIRCUIT HAVING A HIGH-VOLTAGE SWITCH

BACKGROUND OF THE INVENTION

The invention relates to an integrated memory circuit, having a high-voltage switch, an input of which is connected to a programming voltage generator and an output of which is connected to an erasable programmable memory, which switch includes a first and a second transistor, control electrodes and first main electrodes which are cross-wise interconnected in order to route charge in a step-wise fashion from the input to the control electrode of one another under the control of mutually complementary clock signals which are coupled to the respective control electrodes via respective capacitances, the output being connected to one of the control electrodes. The invention also relates to a high-voltage switch which is suitable for use in such a memory circuit. A switch of this kind serves to couple a point carrying a high programming voltage to or to disconnect such a point from a programming voltage input of the memory. Because an excessively fast increase of the programming voltage across the memory has an adverse effect on the service life of the memory, the switch should more or less gradually build up the full programming voltage across the memory.

Such a memory circuit and switch are known from: Donaldson, D. D. et al; "+5 V-Only 32K EEPROM", ISSCC Digest of Technical Papers, pp. 168–169, February 1983. In the known memory circuit the first transistor is of the depletion type and the second transistor is of the enhancement type. The second main electrode of the first transistor is connected directly to the input, the second main electrode of the second transistor being connected to the input via the current channel of the first transistor. The alternating clock signals on the capacitances step-wise build up a voltage at the relevant junction point by routing charge, via the current channels of the transistors, from the input to the junction point of the control electrode of the first transistor and the first main electrode of the second transistor, which junction point is coupled to the output. Because the first transistor is of the depletion type, the switch already operates in response to a clock signal of low amplitude.

It is a drawback of the known memory circuit that the depletion-type transistor necessitates an additional masking step in the manufacture of the integrated circuit, which has a cost increasing effect. A further drawback of the known memory circuit is that the switch is susceptible to crosstalk on the clock lines, because the switch already responds to clock signals of low amplitude. Because the switch is arranged in the vicinity of other active circuits on the chip, such crosstalk is always present to some extent. Therefore, it is an object of the invention to provide a memory circuit in which the switch is simply realized and operates reliably despite crosstalk on the clock lines.

SUMMARY OF THE INVENTION

To achieve this, a memory circuit in accordance with the invention is characterized in that the transistors are of the enhancement type. Because both transistors are of the enhancement type, the switch operates under the control of clock signals having an amplitude near a transistor threshold voltage. Clock signals having such an amplitude can be simply derived from the supply voltage of the erasable programming memory. The switch as presented by the invention is itself less effective than the known switch. Considering it separate from the remainder of the circuit, therefore, there is no reason whatsoever to replace a depletion transistor by an enhancement transistor. However, the circuit per se becomes more reliable and cheaper when the novel switch is used.

An embodiment of a memory circuit in accordance with the invention is characterized in that second main electrodes of the transistors are connected to the input. The build-up in time of the charge can thus be more accurately controlled in small steps, because in each clock cycle both transistors successively conduct a small amount of charge directly from the input to the control electrode of one another.

A further embodiment of a memory circuit in accordance with the invention is characterized in that at least one diode is included in at least one of the paths between the first main electrode of one transistor and the control electrode of the other transistor. As a result of this set-up, between the cathode of the diode and the control electrode of the transistor connected thereto there can be obtained a voltage which is one threshold voltage higher than the input voltage in case one diode is included in the path.

A further embodiment of a memory circuit in accordance with the invention is characterized in that the transistors of the switch are separated from one another by channel stoppers and in that the channel stopper comprises a polysilicon track underneath a metal which emerges from a diffusion region, the polysilicon track being connected to a positive supply voltage when the switch comprises P-channel transistors and to a negative supply voltage when the switch comprises N-channel transistors. The channel stoppers are needed because parasitic transistors are liable to conduct in view of the high voltages present. The proposed channel stoppers have the advantage that they can be simply realized.

BRIEF DESCRIPTION OF THE DRAWING

The invention will be described in detail hereinafter with reference to the drawing, in which.

DESCRIPTION OF THE PREFERRED EMBODIMENTS

Figure 1:
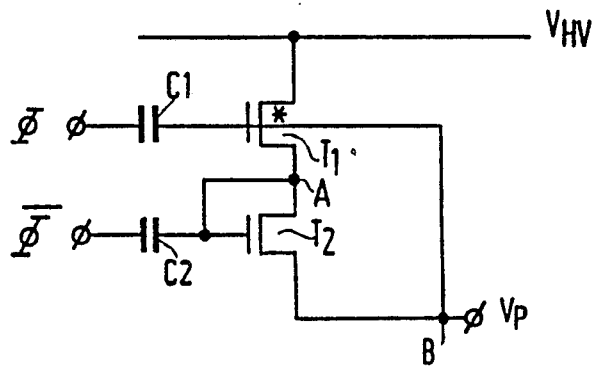
FIG. 1 shows a known switch.

FIG. 1 shows a known switch. The switch comprises a transitor $T_1$ of the depletion type and a transistor $T_2$ of the enhancement type, the control electrodes and first main electrodes of which are cross-wise interconnected. The second main electrode of the transistor $T_1$ is coupled to the programming voltage generator (not shown) which supplies a voltage $V_{HV}$, the control electrode of the transistor $T_1$ and the first main electrode of the transistor $T_2$, together constituting a junction point B, being coupled to the memory (not shown). The second main electrode of the transistor $T_2$ is connected to its control electrode and to the first main electrode of the first transistor $T_1$, via a junction point A. The control electrodes of the transistors receive the mutually complementary clock signals $\phi$ and $\bar\phi$ capacitances $C_1$ and $C_2$. Because the charge transport from the generator to the memory is controlled exclusively by the clock signals, the absolute value $|V_{T1}|$ of the threshold voltage of the transistor $T_1$ should be smaller than the threshold voltage $V_{T2}$ of the transistor $T_2$. When this condition is not satisfied, a quiescent current could occur in the absence of the clock signals.

In the case of a high clock signal $\bar\phi$ the junction point A is charged to one threshold voltage $|V_{T1}|$ above the voltage at the junction point B, regardless of the amplitude of the clock signal. In the case of a high clock signal $\phi$, the charge at the junction point A is conducted to the junction point B via the transistor $T_2$ which is connected as a diode. Thus, the junction point B is step-wise charged to an output voltage $V_p$ equal to $V_{HV}$.

Figure 2:
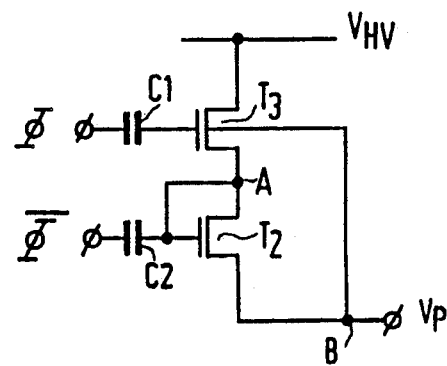
FIG. 2 shows a first embodiment of a switch suitable for use in a memory circuit in accordance with the invention.

FIG. 2 shows a first embodiment of a switch suitable for use in a memory circuit in accordance with the invention. The depletion transistor $T_1$ of FIG. 1 is replaced by an enhancement transistor $T_3$. For charge transport in the presence of a high clock signal $\phi$, the voltage at the control electrode of the transistor $T_3$, being the sum of the voltage due to the presence of charge at the junction point B (capacitance $C_1$) and the high clock signal, should be one threshold voltage higher than the voltage at the junction point A. Crosstalk on the clock lines is thus prevented from exerting excessive effects on the behavior of the switch.

Figure 3:
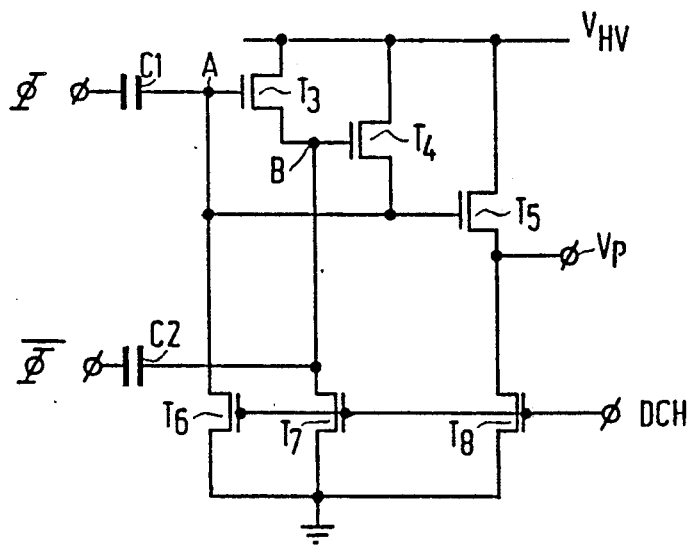
FIG. 3 shows a second embodiment of a switch suitable for use in a memory circuit in accordance with the invention.

FIG. 3 shows a second embodiment of a switch suitable for use in a memory circuit in accordance with the invention. The transistor $T_2$ of FIG. 2 is replaced by a transistor $T_4$ which is of the same type but which has a second main electrode connected to the input. The junction points A and B now comprise their own charging path in the form of the transistor $T_4$ and the transistor $T_3$. After the clock signal has made the transistor $T_3$ conductive via the capacitance $C_1$, thus charging the junction point B, the clock signal $\bar\phi$ is added, via the capacitance $C_2$, to the voltage at the junction point B, so that the transistor $T_4$ becomes conductive and charges the junction point A to one threshold voltage below the voltage at the junction point B. The output transistor $T_5$, having a control electrode connected to the junction point A and a current channel between the high-voltage point $V_{HV}$ and the output, is provided in order to prevent a current decrease on the output from disturbing the building up of the voltage in the transistor loop. The transistors $T_6$, $T_7$ and $T_8$ are provided in order to discharge the junction points A and B and the output to ground under the control of a signal DCH.

Figure 4:
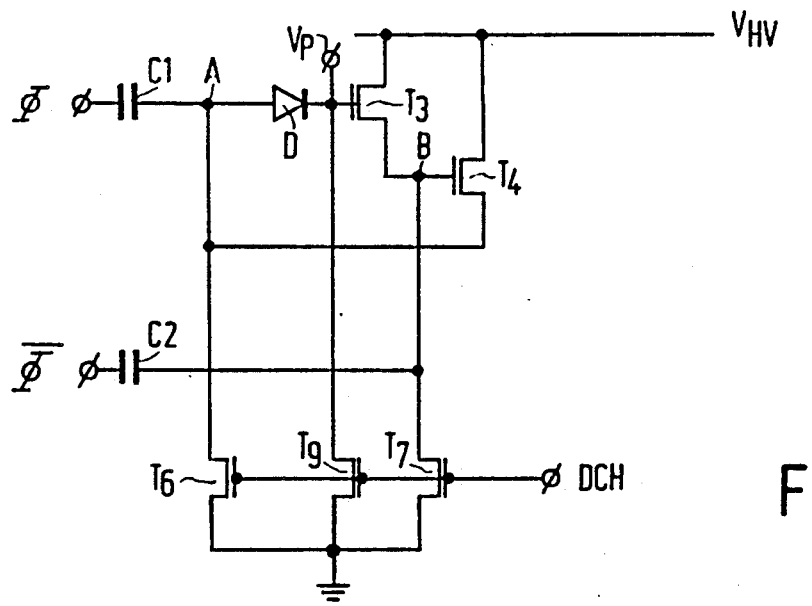
FIG. 4 shows a third embodiment of a switch suitable for use in a memory circuit in accordance with the invention.

FIG. 4 shows a third embodiment of a switch suitable for use in a memory circuit in accordance with the invention. The elements which correspond to FIG. 3 are denoted by corresponding references. Between the junction point A and the control electrode of the transistor $T_3$ there is provided a diode. During the building up, charge is collected behind the diode, causing a voltage which is higher than $V_{HV}$. In this case the programming voltage generator need not generate the full programming voltage. The last step of the programming voltage is then added in the switch. The transistors $T_6$, $T_7$ and $T_9$ are provided for discharging the junction points A and B and the output under the control of a signal DCH.

I claim:

1. An integrated memory circuit, comprising a high-voltage switch, an input of which is connected to a programming voltage generator and an output of which is connected to an erasable programming memory, said switch comprising first and second transistors, control electrodes and first main electrodes of said transistors being cross-wise interconnected in order to route charge to build up voltages in a step-wise fashion from the input to the control electrodes under the control of mutually complementary clock signals which are capacitively coupled to the respective control electrodes, the output being connected to one of the control electrodes, characterized in that the transistors are both of the enhancement type and at least one diode is included in at least one of the paths between the first main electrode of one transistor and the control electrode of the other transistor.

2. An intergrated memory circuit, comprising a high-voltage switch, an input of which is connected to a programming voltage generator and an output of which is connected to an erasable programmable memory, said switch comprising first and second transistors, control electrodes and first main electrodes of said transistors being cross-wise interconnected in order to route charge to build up voltages in a step-wise fashion from the input to the control electrodes under the control of mutually complementary clock signals which are capacitively coupled to the respective control electrodes, the output being connected to one of the control electrodes, characterized in that the transistors are both of the enhancement type and further comprising a third transistor, a control electrode of which is connected to the control electrode of one of the first and second transistors and a current channel of which is connected between the input and the output.

3. An integrated memory circuit, comprising a high-voltage switch, an input of which is connected to a programming voltage generator and an output of which is connected to an erasable programmable memory, said switch comprising first and second transistors, control electrodes and first main electrodes of said transistors being cross-wise interconnected in order to route charge to build up voltages in a step-wise fashion from the input to the control electrodes under the control of mutually complementary clock signals which are capacitively coupled to the respective control electrodes, the output being connected to one of the control electrodes, characterized in that the transistors are both of the enhancement type and further comprising controllable discharge paths for the discharging of said control electrodes and the output.

* * * * *